United States Patent
Le et al.

(10) Patent No.: US 6,721,180 B2
(45) Date of Patent: Apr. 13, 2004

(54) COOLING HOOD FOR CIRCUIT BOARD

(75) Inventors: Thoai-Thai Le, Cary, NC (US);
Guenter Gerstmeier, Chapel Hill, NC (US); David SuitWai Ma, Cary, NC (US); Tao Wang, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/209,025

(22) Filed: Jul. 31, 2002

(65) Prior Publication Data

US 2004/0022024 A1 Feb. 5, 2004

(51) Int. Cl.[7] .................................................. H05K 7/20
(52) U.S. Cl. ................. 361/695; 62/259.2; 165/80.3; 165/121; 361/719; 361/720; 454/184
(58) Field of Search ...................... 62/259.2; 165/80.3, 165/121, 126; 361/687, 700, 694–697, 719–720; 454/184

(56) References Cited

U.S. PATENT DOCUMENTS

| | | | | |
|---|---|---|---|---|
| 5,422,787 A | * | 6/1995 | Gourdine | 361/697 |
| 6,113,485 A | * | 9/2000 | Marquis et al. | 454/184 |
| 6,330,154 B1 | * | 12/2001 | Fryers et al. | 361/695 |
| 6,377,459 B1 | * | 4/2002 | Gonsalves et al. | 361/700 |
| 6,504,718 B2 | * | 1/2003 | Wu | 361/695 |

* cited by examiner

Primary Examiner—Gregory D. Thompson
(74) Attorney, Agent, or Firm—Brinks Hofer Gilson & Lione

(57) ABSTRACT

A cooling hood for a circuit board is provided. The circuit board includes at least one semiconductor device. The cooling hood includes a duct mounted onto the circuit board and surrounding at least a portion of the semiconductor device. The duct forms an inlet and an outlet. A cooling medium enters the duct through the inlet and exits the duct through the outlet.

21 Claims, 2 Drawing Sheets

COOLING HOOD FOR CIRCUIT BOARD

BACKGROUND

Semiconductor devices are currently in widespread use in a variety of electronic components. Semiconductor devices may be used for a variety of reasons, such as to retain information, as in a non-volatile memory device, or to perform a calculation, such as in a microprocessor or in a digital signal processor. Semiconductor devices consume a certain amount of power to perform tasks. With the continuing emphasis on miniaturization and enhanced performance, such as a higher operating frequency, the amount of power consumed, and hence, the heat generated by a semiconductor device, has steadily been increasing. The heat generated by a semiconductor device can be so intense that the semiconductor device itself could become damaged or fail. Therefore, in some instances, it has become necessary to employ devices to dissipate the heat generated by a semiconductor device.

Various devices are employed to dissipate the heat generated by semiconductor devices. For example, fans dissipate the heat generated by power supplies and microprocessors. Additionally, heat sinks and heat spreaders may be attached to semiconductor devices to dissipate heat. Moreover, in some instances, more exotic cooling elements, such as Peltier coolers, are employed to effectively dissipate heat from a semiconductor device. However, conventional methods for cooling semiconductor devices, such those described above, are often expensive to implement, since often times, more than one of these devices is employed. Additionally, these conventional methods may be ineffective in cooling a semiconductor device, or a plurality of semiconductor devices. Thus, there is a need for a device or method which is cost efficient and which effectively cools a semiconductor device or a plurality of semiconductor devices.

SUMMARY

The present invention is defined by the following claims, and nothing in this section should be taken as a limitation on those claims. By way of introduction, the preferred embodiments described below relate to a cooling hood for a circuit board. The circuit board includes at least one semiconductor device. The cooling hood includes a duct mounted onto the circuit board and surrounding at least a portion of the semiconductor device. The duct forms an inlet and an outlet. A cooling medium enters the duct through the inlet and exits the duct through the outlet. By using a duct to distribute the cooling medium to the semiconductor device mounted on the circuit board, the semiconductor device can more effectively and more efficiently be cooled without a separate or additional cooling device.

The preferred embodiments further relate to a method for cooling a semiconductor device mounted on a circuit board. The method includes mounting a duct onto the circuit board surrounding the semiconductor device. The duct forms an inlet and an outlet. The method further includes flowing a cooling medium through the duct. Further aspects and advantages of the invention are discussed below in conjunction with the preferred embodiments.

DETAILED DESCRIPTION OF THE PRESENTLY PREFERRED EMBODIMENTS

Figure 1:
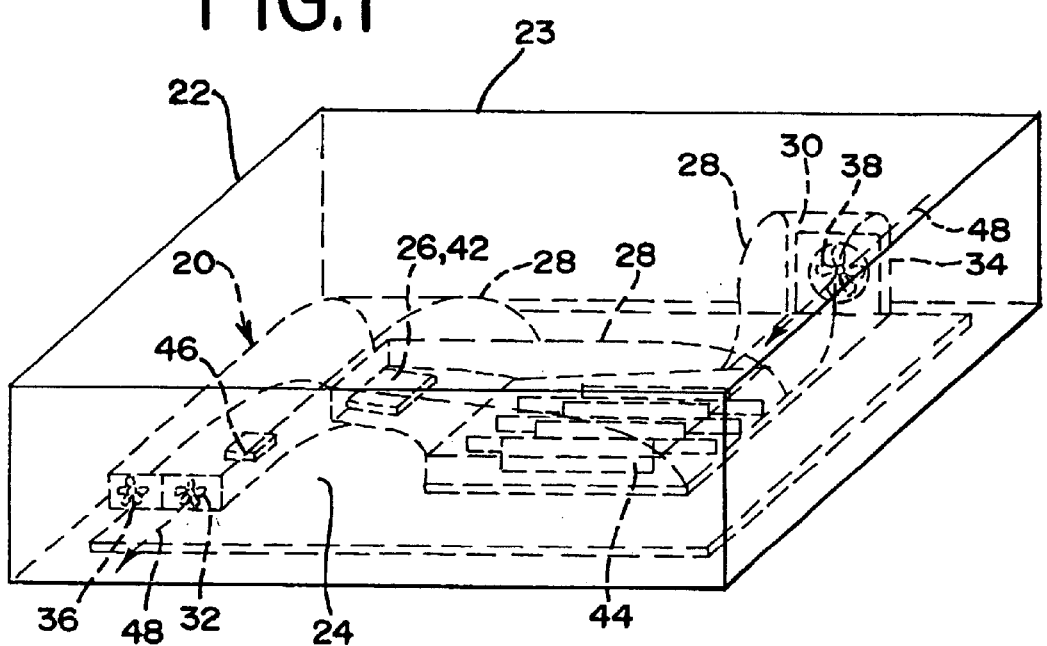
FIG. 1 depicts a perspective view of an electronic device including an exemplary cooling hood for cooling a semiconductor device, according to one embodiment.

FIG. 1, shows a perspective view of an electronic device 22 including an exemplary cooling hood 20 for cooling a semiconductor device 26 mounted on a circuit board 24, in accordance with one embodiment. The electronic device 22 may be any one or more of a multitude of electronic based devices, including but not limited to computers, automobiles, airplanes, satellites, and the like. In one embodiment, the electronic device 22 is a personal computer. The electronic device 22 includes a housing 23, as illustrated in FIG. 1. The housing 23 forms an inlet 34 for allowing a cooling medium 48 to enter the housing 23, as illustrated in FIGS. I and 2. Additionally, the housing 23 forms an outlet 36 for allowing the cooling medium 48 to exit the housing 23. The cooling hood 20 is mounted within the housing 23 and forms an inlet 30 for allowing a cooling medium 48 to enter the cooling hood 20, and an outlet 32 for allowing the cooling medium 48 to exit the cooling hood 20. The cooling medium 48 comprises any one of a number of fluids or gases that can be used for cooling a device, such as, air, water, freon, and liquid nitrogen. In one embodiment, the cooling medium 48 is ambient air that surrounds the electronic device 22.

The circuit board 24 comprises at least one semiconductor device 26 mounted on the circuit board 24. The semiconductor device 26 may take the form of an integrated circuit; a group of integrated circuits, such as a semiconductor memory module; a semiconductor memory device, such as an SRAM memory chip, a DRAM memory chip, an EPROM memory chip, and an EEPROM memory chip; a microprocessor; a programmable logic device; a data communications device; a clock generation device; and so forth. In one embodiment, the circuit board 24 comprises a microprocessor 42, a semiconductor memory device 44, and a logic chip 46, as illustrated in FIGS. 1–2.

Figure 2:
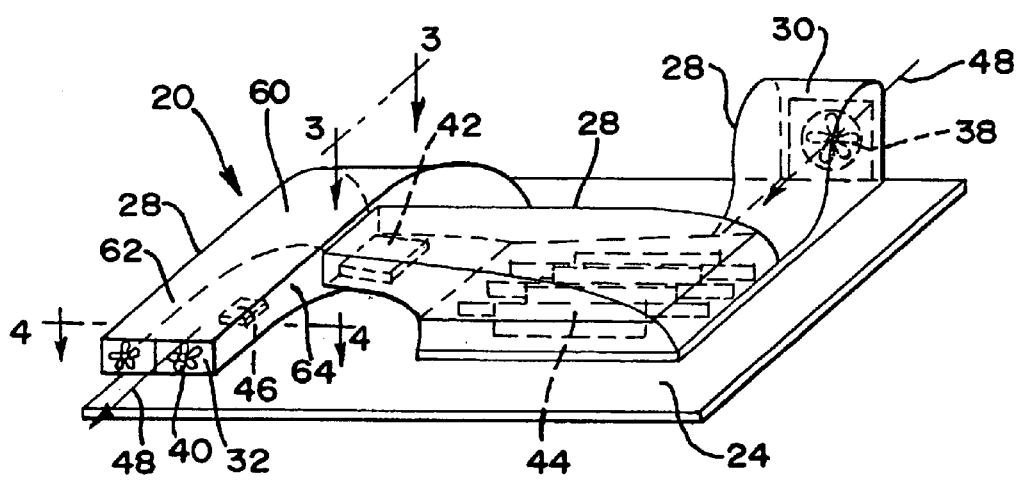
FIG. 2 depicts a perspective view of the exemplary cooling hood from FIG. 1, including sectional lines 3—3 and 4—4, according to one embodiment.
Figure 3:
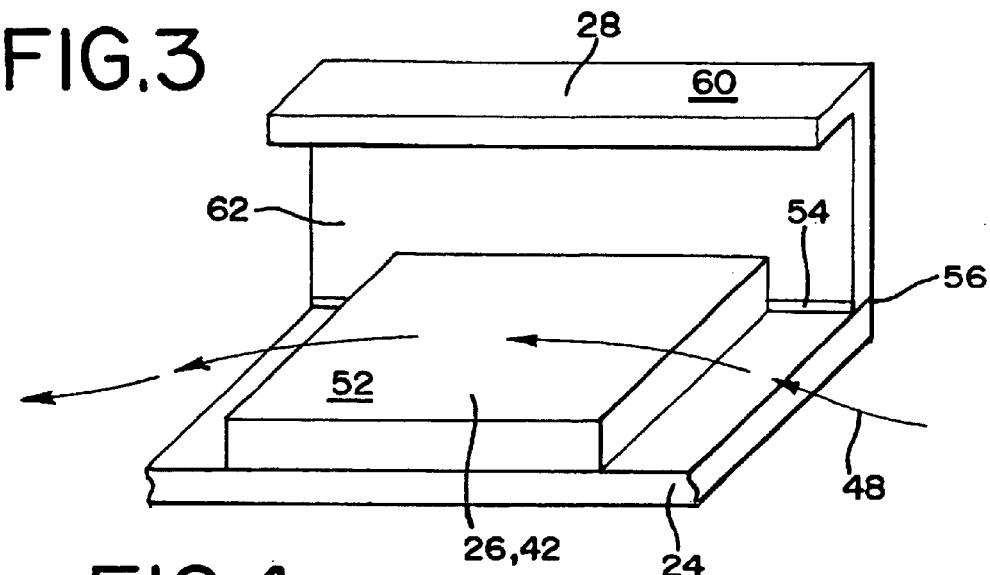
FIG. 3 depicts an enlarged partial cross-sectional view of the cooling hood from FIG. 2, according to one embodiment.

The cooling hood 20 includes at least one duct 28 mounted onto the circuit board 24 and surrounding at least a portion of the semiconductor device 26, as illustrated in FIGS. 1 and 2. Preferably the entire semiconductor device 26 is surrounded by and/or encapsulated by the duct 28 so that the cooling medium 48 can flow over the entire surface 52 of the semiconductor device 26, as illustrated in FIGS. 1–3. In one embodiment, the duct 28 forms a hollow channel 50 around the semiconductor device 26 and the cooling medium 48 flows through the hollow channel 50, as illustrated in FIG. 4.

Figure 4:
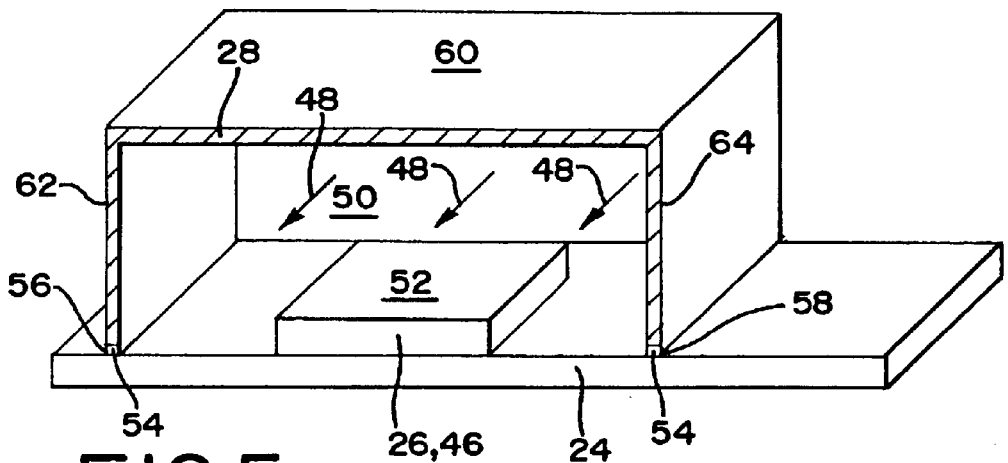
FIG. 4 depicts an enlarged cross-sectional view of the cooling hood from FIG. 2, according to one embodiment.

The duct 28 includes at least two sides, such as a top side 60, a first side 62, and a second side 64, which are connected with the circuit board 24 at at least two edges 56, 58, as illustrated in FIGS. 3–4. The duct 28 is manufactured from a material that is non-permeable and does not allow the cooling medium to escape through or leak out from a surface 60, 62, 64 of the duct 28, such as plastic, metal, and rubber. The edges 56, 58 of the duct 28 are connected with the circuit board 24 and prevent at least a portion of the cooling medium 48 from escaping the duct 28. In one embodiment, the duct 28 is hermetically sealed to the circuit board 24. Sealing elements 54 mount in between the edges 56, 58 and the circuit boards 24, to prevent the cooling medium from leaking out from the bottom of the duct 28, as illustrate in FIGS. 3-4. Preferably, the sealing elements 54 are made from materials such as rubber and latex. Preferably, the edge 56 is opposed to the edge 58 and each of the edges 56, 58 are located on an opposing side of the semiconductor device 26, as illustrated in FIG. 4. Alternatively, the duct 28 may be mounted to the housing 23 for positioning the duct 28 over the circuit board 24 and the semiconductor device 26.

The duct 28 forms an inlet 30 and an outlet 32, wherein the cooling medium 48 enters the duct 28 through the inlet 30, and wherein the cooling medium 48 exits the duct 28 through the outlet 32. In one embodiment, the cooling hood 20 includes an inlet fan 38 mounted near the inlet 30 of the duct 28, wherein the inlet fan 38 draws the cooling medium 48 into the duct 28, as illustrated in FIGS. 1–2. Additionally, the cooling hood 20 includes an outlet fan 40 mounted near the outlet 32 of the duct 28, wherein the outlet fan 40 draws the cooling medium 48 out of the duct 28, as illustrated in FIGS. 1–2. The inlet fan 38 and the outlet fan 48 can be any commercially obtainable fan, such as a ball-bearing fan, a pump, or any other such device which can draw the cooling medium 68 into or out of the duct 28.

Figure 5:
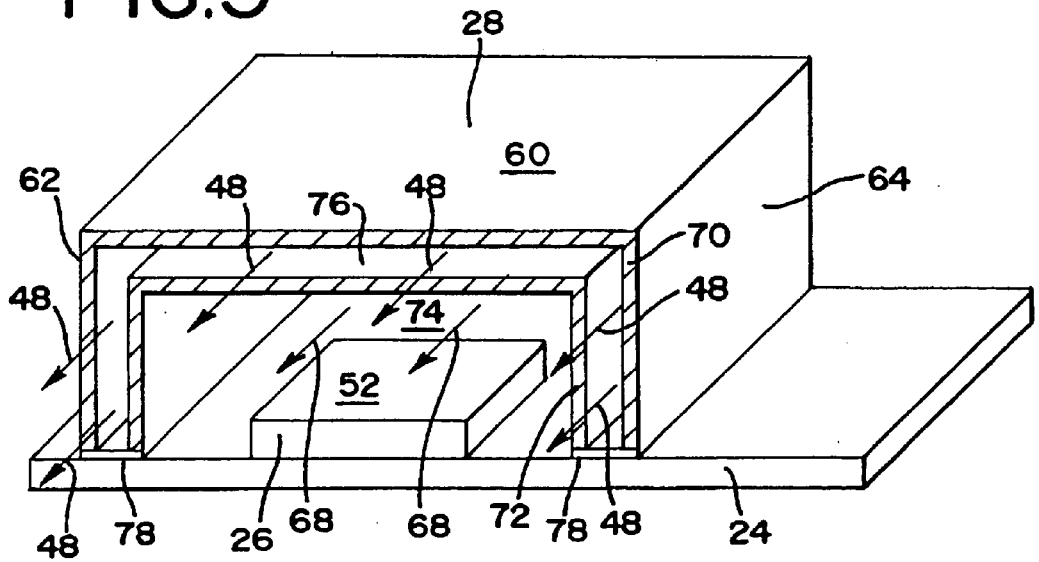
FIG. 5 depicts an enlarged cross-sectional view of the cooling hood, according to another embodiment.

In one embodiment, the duct 28 has an outer duct 70 and an inner duct 72, wherein the outer duct 70 surrounds the inner duct 72, and wherein the inner duct 72 surrounds at least a portion of the semiconductor device 26, as illustrated in FIG. 5. A first cooling medium 68 flows through a first channel 74 created by the inner duct 72, and a second cooling medium 48 flows through a second channel 76 created between the inner duct 72 and the outer duct 70, as illustrated in FIG. 5. Sealing elements 78 are located between the duct 28 and the circuit board 24 and seal the duct 28 with the circuit board 24 to prevent leakage of the cooling mediums 48, 68 between the first channel 74 and the second channel 76 or between the cooling hood 20 and the circuit board 24, as illustrated in FIG. 5. By providing two separate channels 74,76 for flowing two separate cooling mediums 48, 68 through the duct 28, the cooling hood 20 can utilize different cooling mediums 48, 68 in order to dissipate the heat from the semiconductor device 26. For example, in one embodiment, the first cooling medium 48 is a fluid, while the second cooling medium 68 is a gas. By flowing a variety of cooling mediums 48, 68 over the semiconductor device 26, the cooling hood 20 may dissipate more heat from the semiconductor device 26. Additionally, by providing two separate channels 74,76, or a channel which is separated by a barrier from the semiconductor device 26, a cooling medium 48 that is a liquid may flow over the semiconductor device 26 without damaging the semiconductor device 26. In alternative embodiments, both cooling mediums 48, 68 are a same type of coolant.

In one embodiment, the cooling hood 20 includes a plurality of interconnected ducts 28 mounted onto the circuit board 24 and surrounding a plurality of semiconductor devices 26, as illustrated in FIGS. 1-2. In one embodiment, the cooling hood 20 includes a single duet 28 mounted onto the circuit board 24 and surrounding a plurality of semiconductor devices 26. By using a plurality of ducts 28 or a single duct 28 having at least one inlet 30 to cool a plurality semiconductor devices 26, the cooling hood 20 can effectively and inexpensively cool a multitude of semiconductor devices 26. The cooling hood has only one inlet 30, to reduce the complexity of the cooling hood 20. The inlet 30 is in a centralized location, so that the air can be easily and evenly distributed into the cooling hood. In one embodiment, the cooling hood 20 has a plurality of inlets 30 in order to provide additional cooling to the semiconductor device 26.

In operation, a cooling medium 48 enters the cooling hood 20 through the inlet 30 of the duct 28. Preferably, the inlet fan 38 draws the cooling medium 48 into the duct 28. Once in the duct 28, the cooling medium 48 flows around and over the semiconductor device 26, dissipating heat from the surface 52 of the semiconductor device 26, as illustrated in FIGS. 3-5. As the heat is dissipated from the semiconductor device 26 and into the cooling medium 48, the cooling medium 48 is heated while the semiconductor device 26 is cooled. Upon cooling the semiconductor device 26, the cooling medium 48 travels through the duct 28 and exists the duct 28 at the outlet 32. Preferably, the outlet fan 40 draws the cooling medium 48 out of the duct 28.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention.

We claim:

1. A cooling hood for a circuit board, the circuit board comprising at least one semiconductor device, the cooling hood comprising:

a duct mounted onto the circuit board and covering at least a portion of the semiconductor device, the duct being configured to channel a flow of a cooling medium across the semiconductor device and having a first side and a second side, the first side defining a first edge and the second side defining a second edge;

a flexible sealing element being configured to seal the duct to the circuit board to prevent leakage of the cooling medium from the duct, the flexible sealing element being disposed between the circuit board and the first edge and the circuit board and the second edge;

an inlet; and an outlet.

2. The cooling hood of claim 1, wherein the duct is hermetically mounted to the circuit board.

3. The cooling hood of claim 1, wherein the cooling medium is one of ambient air and fluid.

4. The cooling hood of claim 1, further comprising an inlet fan mounted near the inlet of the duct, wherein the inlet fan draws the cooling medium into the duct.

5. The cooling hood of claim 1, further comprising an outlet fan mounted near the outlet of the duct, wherein the outlet fan draws the cooling medium out of the duct.

6. The cooling hood of claim 1, wherein the semiconductor device is one of a semiconductor memory, a microprocessor, and a programmable logic device.

7. The cooling hood of claim 1, wherein the duct further comprises a top surface, a first side surface, and a second side surface.

8. The cooling hood of claim 1, wherein the duct surrounds the entire semiconductor device.

9. A cooling hood for a circuit board, the circuit board comprising a plurality of semiconductor devices, the cooling hood comprising:

a first duct mounted adjacent the circuit board and covering a plurality of semiconductor devices, wherein the duct forms an inlet and an outlet, the first duct being configured to channel a flow of a cooling medium across the semiconductor devices and having a first side and a second side, the first side defining a first edge and the second side defining a second edge;

a flexible sealing element being configured to seal the duct to the circuit board to prevent leakage of the cooling medium from the duct, the flexible sealing element being mounted between the circuit board and the first edge and the circuit board and the second edge; and a housing separate from and covering the first duct.

10. The cooling hood of claim 9, further comprising a second duct mounted onto the circuit board and surrounding at least one semiconductor device.

11. The cooling hood of claim 9, wherein the duct is hermetically mounted to the circuit board.

12. The cooling hood of claim 9, wherein the cooling medium is one of ambient air and fluid.

13. The cooling hood of claim 9, further comprising an inlet fan connected with the duct and mounted near the inlet of the duct, wherein the cooling fan draws the cooling medium into the duct.

14. The cooling hood of claim 9, further comprising an outlet fan connected with the duct and mounted near the outlet of the duct, wherein the cooling fan draws the cooling medium out of the duct.

15. The cooling hood of claim 9, wherein the duct further comprises a first and a second edge, wherein the first and second edges are connected with the circuit board, and wherein the first edge is connected with the second edge by a first surface.

16. A method for cooling a semiconductor device mounted on a circuit board, the method comprising:

mounting a duct onto the circuit board, the duct covering at least a portion of the semiconductor device and forming an inlet and an outlet, and having a first side and a second side, the first side defining a first edge and the second side defining a second edge;

sealing the duct to the circuit board with a flexible sealing element configured to seal the duct to the circuit board to prevent leakage of the cooling medium from the duct, the flexible sealing element being disposed between the circuit board and the first edge and the circuit board and the second edge; and flowing a cooling medium through the duct.

17. The method of claim 16, wherein the flowing of the cooling medium comprises forcing the cooling medium through the duct with a fan.

18. The method of claim 16, further comprising hermetically mounting the duct to the circuit board.

19. The method of claim 16, wherein the duct forms a hollow channel around the semiconductor device, and wherein the cooling medium flows through the hollow channel.

20. The method of claim 16, wherein the duct comprises at least two surfaces which are connected with the circuit board at at least two edges.

21. The method of claim 16, wherein the circuit board comprises a plurality of semiconductor devices, and wherein the duct surrounds a plurality of semiconductor devices.

* * * * *